(12) United States Patent
Kuo

(10) Patent No.: US 11,522,129 B2
(45) Date of Patent: Dec. 6, 2022

(54) SEMICONDUCTOR STRUCTURE AND MANUFACTURING METHOD THEREOF

(71) Applicant: UNITED MICROELECTRONICS CORP., Hsin-Chu (TW)

(72) Inventor: Chih-Wei Kuo, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 17/084,639

(22) Filed: Oct. 30, 2020

(65) Prior Publication Data
US 2022/0102629 A1    Mar. 31, 2022

(30) Foreign Application Priority Data
Sep. 25, 2020    (CN) .......................... 202011020940.9

(51) Int. Cl.
*H01L 45/00*    (2006.01)
*H01L 27/24*    (2006.01)

(52) U.S. Cl.
CPC .......... *H01L 45/12* (2013.01); *H01L 27/2463* (2013.01); *H01L 45/16* (2013.01)

(58) Field of Classification Search
CPC .................................................... H01L 45/12
See application file for complete search history.

(56) References Cited

U.S. PATENT DOCUMENTS

| | | | |
|---|---|---|---|
| 8,872,149 B1 * | 10/2014 | Hsieh | H01L 45/12 |
| | | | 257/2 |
| 9,099,647 B2 | 8/2015 | Liao | |
| 9,129,845 B2 | 9/2015 | Liu | |
| 9,257,642 B1 | 2/2016 | Chang | |
| 9,627,613 B2 | 4/2017 | Trinh | |
| 9,847,481 B2 | 12/2017 | Chang | |
| 9,859,335 B1 | 1/2018 | Hsu | |
| 2015/0147864 A1 * | 5/2015 | Liao | H01L 45/1253 |
| | | | 438/382 |
| 2019/0036014 A1 * | 1/2019 | Ha | H01L 43/12 |

\* cited by examiner

*Primary Examiner* — Marvin Payen
(74) *Attorney, Agent, or Firm* — Winston Hsu

(57) ABSTRACT

The invention provides a semiconductor structure, the semiconductor structure includes a resistance random access memory (RRAM), a first spacer located at two sides of the RRAM, a second spacer located outside the first spacer, wherein the second spacer contains metal material or metal oxide material, and a third spacer located outside the second spacer.

20 Claims, 5 Drawing Sheets

US 11,522,129 B2

SEMICONDUCTOR STRUCTURE AND MANUFACTURING METHOD THEREOF

BACKGROUND OF THE INVENTION

1. Field of the Invention

The present invention relates to the field of semiconductors, in particular to a resistive random access memory (RRAM) with a strengthened spacer.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

A RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The invention provides a semiconductor structure, which comprises a resistance random access memory (RRAM), a first spacer located at two sides of the RRAM, a second spacer located outside the first spacer, wherein the second spacer contains metal material or metal oxide material, and a third spacer located outside the second spacer.

The invention also provides a manufacturing method of semiconductor structure, which comprises providing a RRAM, forming a first spacer junction on both sides of the RRAM, forming a second spacer outside the first spacer, wherein the second spacer contains metal material or metal oxide material, and forming a third spacer outside the second spacer.

In some embodiments of the present invention, the spacer of the resistance random access memory is strengthened, and further, the second spacer and the third spacer are added outside and above the first spacer. Because the second spacer is made of metal or metal oxide, metal nitride, etc., the material characteristics are quite different from those of the first spacer or the third spacer, and the second spacer with sufficient thickness covers the top of the first spacer. Therefore, when the opening is produced by etching process, the second spacer can effectively protect the RRAM, especially the area between the RRAM and the spacer, and avoid an issue that forming a gap in this area, and the subsequently formed conductive layer will not fill the gap and affect the performance of the RRAM.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
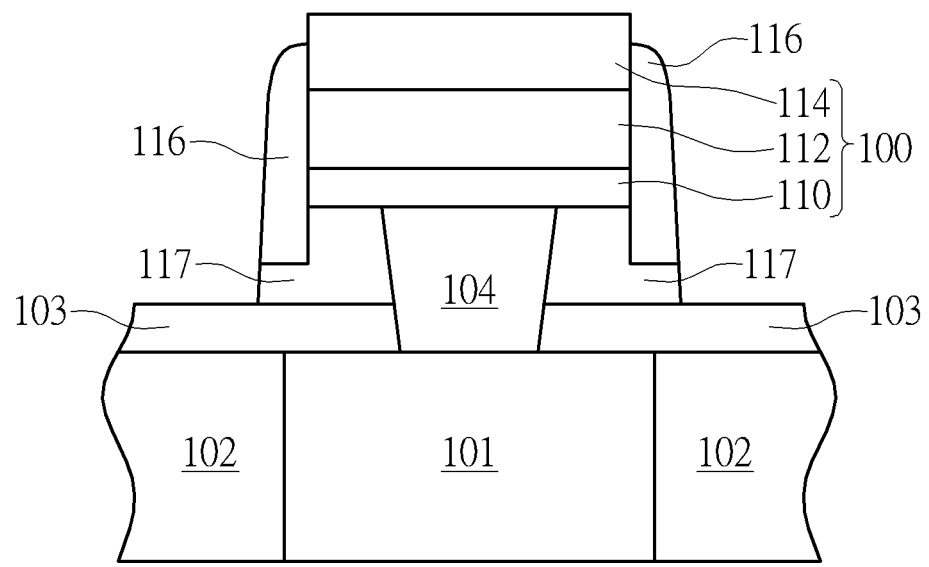
FIG. 1 to FIG. 2 show schematic diagrams of semiconductor structures fabricated according to the first preferred embodiment of the present invention.
Figure 2:
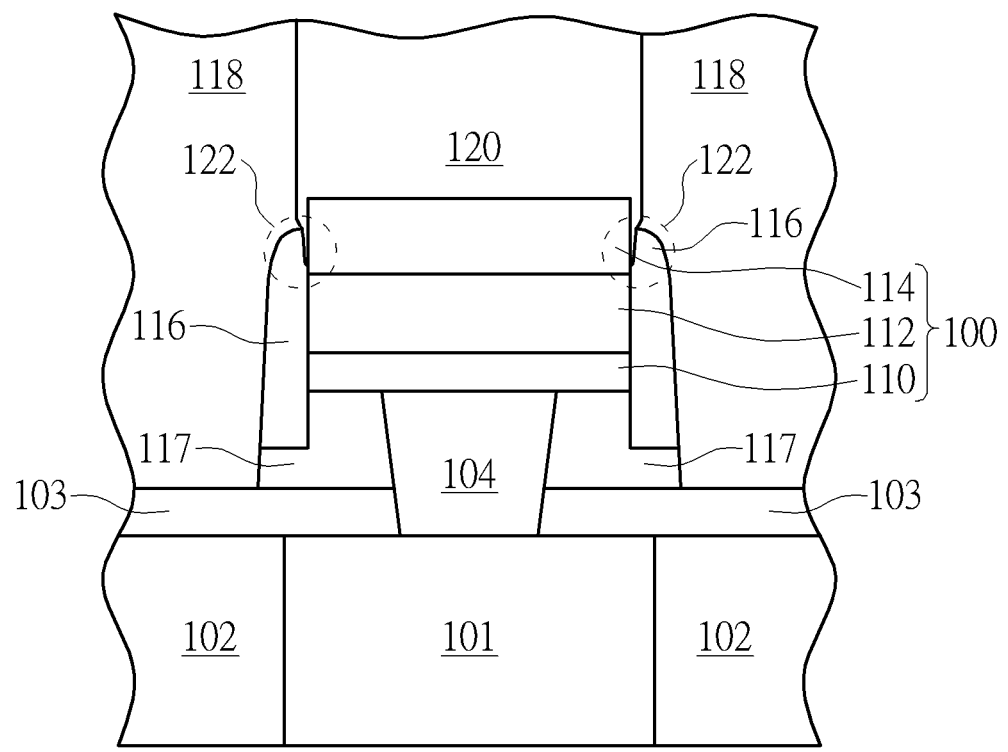

Please refer to FIG. 1 to FIG. 2, which are schematic diagrams of semiconductor structures fabricated according to the first preferred embodiment of the present invention. As shown in FIG. 1, firstly, a resistive random access memory (RRAM) 100 is provided, the RRAM 100 is electrically connected with a contact structure 104. The contact structure 104 may be located in a single layer or a plurality of dielectric layers, and its lower part may be electrically connected with another contact structure or wire. Taking this embodiment as an example, the contact structure 104 is located in the dielectric layer 103 and the dielectric layer 117, and there is another wire 101 under the contact structure 104, which is electrically connected with the contact structure and located in the dielectric layer 102. The dielectric layer 102 and the dielectric layer 117 are, for example, one of the inter-metal dielectric (IMD) layers in a semiconductor structure, the dielectric layer 103 may be a liner layer, and the wires 101 and the contact structure 104 are, for example, wires or conductive vias in IMD. The materials of the dielectric layer 102, the dielectric layer 103 and the dielectric layer 117 may include insulating materials such as silicon oxide, silicon nitride and silicon oxynitride, while the contact structure 104 includes conductive materials such as tungsten, cobalt, copper, aluminum or other conductive materials, and the present invention is not limited thereto.

The resistive random access memory 100 is located on the dielectric layer 102 and electrically connected with the contact structure 104. Generally speaking, the resistance random access memory 100 can at least include a lower electrode 110, a resistance conversion layer 112 and an upper electrode 114. The lower electrode 110 and the upper electrode 114 are made of conductive materials such as titanium, tantalum, titanium nitride, tantalum nitride, etc., and the resistance conversion layer 112 comprises a dielectric material with a dielectric constant greater than 4, such as hafnium oxide (HfO$_2$), hafnium silicon oxide (hafnium silicon oxide), HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (yttrium oxide), Y$_2$O$_3$), zirconium oxide (ZrO$_2$), strontium titanate (SrTiO$_3$), zirconium silicon oxide (ZrSiO$_4$), hafnium zirconate (hafnium zirconium oxide, Group consisting of HfZrO$_4$), strontium bismuth tantalate (srBi$_2$Ta$_2$O$_9$, SBT), lead zirconate titanate (PbZrxTi$_1$-xO$_3$, PZT, barium strontium titanate (BaxSr$_1$-xTiO$_3$, BST), or combinations thereof In addition, except for to the above materials, the resistance random access memory 100 may also include more material layers, which is also within the scope of the present invention. Taking one embodiment of the present invention as an example, the resistive random access memory 100 includes a lower electrode (made of TaN), a resistance conversion layer (made of Ta$_2$O$_5$), a metal layer (made of iridium (Ir)) and an upper electrode (made of TaN) in order from bottom to top. This structure also falls within the scope of the present invention. However, it should be noted that this structure is only one example of the present invention, and the resistive random access memory comprise other materials also belongs to the scope of the present invention.

After the formation of the RAM 100, a first spacer 116 is formed on the side of the RAM 100, which is used to protect the RRAM 100. The material of the first spacer 116 is, for example, silicon nitride. In addition, it is worth noting that in this embodiment, before forming the first spacer 116, the dielectric layer 102 around the resistive random access memory 100 may be partially etched, and then the first spacer 116 may be formed by deposition, etching back, etc. Therefore, the top surface of the first spacer 116 may be lower than the top surface of the upper electrode 114. In addition, an L-shaped dielectric layer 117 may be formed under the first spacer 116 due to etching.

Then, as shown in FIG. 2, a dielectric layer 118 and another contact structure 120 located in the dielectric layer 118 are formed over the resistive random access memory 100, and the contact structure 120 is electrically connected with the upper electrode 114 of the resistive random access memory 100. The contact structure 120 described here is, for example, another conductive via in a semiconductor structure. So as to connect the resistance random access memory 100 to other cells of the semiconductor device through conductive vias or wires.

However, as shown in FIG. 2, the applicant found that in an embodiment of the present invention, when forming the contact structure 120 to electrically connect the upper electrode 114 of the resistance random access memory 100, it is necessary to perform an etching step to form an opening (not shown) in the dielectric layer 118 and expose the upper electrode 114, and then fill the opening with a conductive material to form the contact structure 120. However, in some embodiments, when the alignment position between the opening and the upper electrode deviates, or when the size of the opening is larger than that of the upper electrode 114, the opening will also expose part of the first spacer 116 adjacent to the upper electrode 114. The upper electrode 114 and the first spacer 116 are made of different materials, and the interface between them is easy to form a weak point, which may be etched during the etching process. A gap is formed between the upper electrode 114 and the first spacer 116, which leads to the gap being filled with the conductive material in the opening, and makes the contact structure 120 produce a tip 122 (the same position as the weak point mentioned above) between the upper electrode 114 and the first spacer 116. The tip 122 of the contact structure 120 may affect the quality of the semiconductor device, which is not conducive to the yield of the semiconductor manufacturing process.

In order to avoid the above issue, in another embodiment of the present invention, the spacer beside the resistance random access memory 100 is strengthened to prevent the gap between the resistance random access memory and the spacer during the etching process from affecting the quality of the semiconductor device. Please refer to FIG. 3 to FIG. 6 below.

Figure 3:
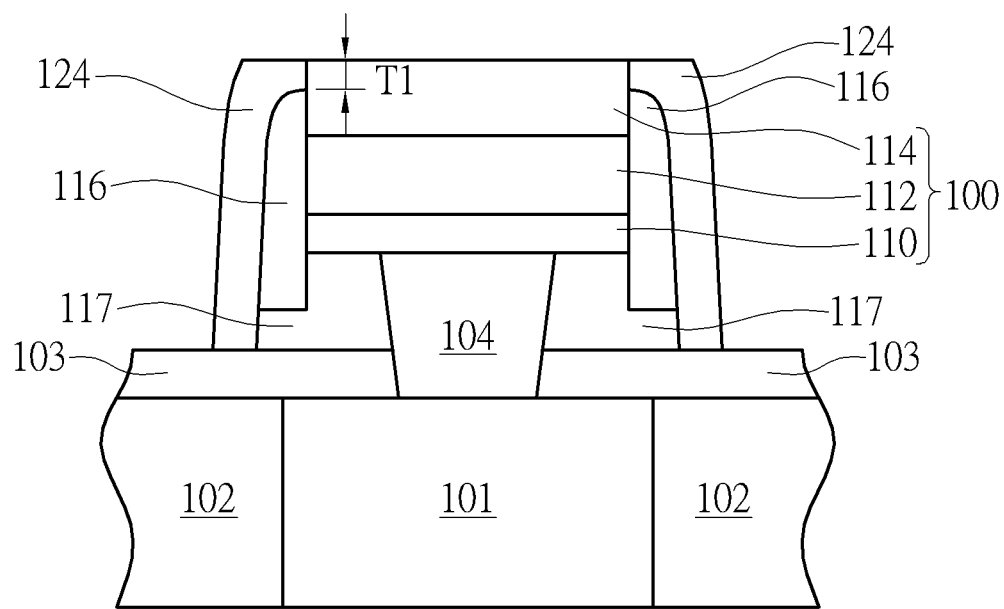
FIG. 3 to FIG. 6 show schematic diagrams of semiconductor structures fabricated according to the second preferred embodiment of the present invention.

FIG. 3 to FIG. 6 show schematic diagrams of semiconductor structures fabricated according to the second preferred embodiment of the present invention. In this embodiment, as shown in FIG. 3, which follows the steps shown in FIG. 1, after forming the structure shown in FIG. 1 (including forming the resistive random access memory 100 and the first spacer 116, etc.), instead of the steps shown in FIG. 2, a second spacer material layer (not shown) is additionally formed above and outside the first spacer 116, and then an etch-back step or a planarization step is performed to remove part of the second spacer material layer, the upper electrode 114 of the resistance random access memory 100 is exposed, and the remaining second spacer material layer is defined as the second spacer 124. In this embodiment, the second spacer 124 covers the upper and side walls of the first spacer 116 and directly contacts the first spacer 116. In this embodiment, the second spacer 124 is made of a material different from that of the first spacer 116, and the two materials have sufficient etching selectivity. Preferably, the material of the second spacer 124 can be selected from metals, metal oxides, metal nitrides and other materials different from common dielectric layers (such as silicon oxide, silicon nitride, silicon oxynitride, etc.), so as not to be easily removed in the etching process. In this embodiment, the material of the second spacer 124 is, for example, titanium, titanium nitride, titanium oxide, tantalum, tantalum nitride, aluminum nitride, aluminum oxide, etc., but the present invention is not limited to this.

In addition, when viewed from a vertical direction, such as the longitudinal direction in FIG. 3, the thickness of parts of the second spacer 124 covering the first spacer 116 is more than 20 nm (such as the thickness T1 shown in FIG. 3 is more than 20 nm). In some embodiments, the thickness T1 is between 20 nm and 60 nm. So as to effectively protect the first spacer 116 and the resistance random access memory 100. In addition, since the second spacer material layer is planarized or be etched in this embodiment, a top surface of the resistive random access memory 100 (that is, the top surface of the upper electrode 114) and a top surface of the second spacer 124 are aligned with each other.

Figure 4:
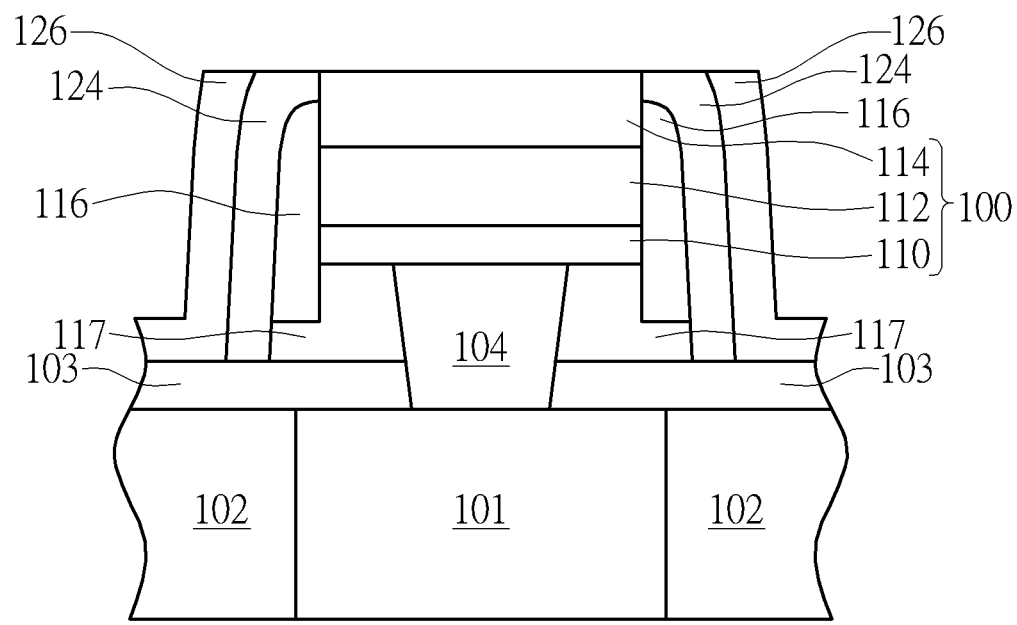

Then, as shown in FIG. 4, a third spacer material layer (not shown) is formed to cover the second spacer 124 and the resistance random access memory 100, and then an etch back step or a planarization step can be performed to remove part of the third spacer material layer to expose the upper electrode 114 of the resistance random access memory 100, and the remaining third spacer material layer is defined as the third spacer 126. In this embodiment, the material of the third spacer 126 is, but not limited to, silicon oxide.

In this embodiment, the materials of the first spacer 116, the second spacer 124 and the third spacer 126 are different from each other. In addition, both the first spacer 116 and the third spacer 126 can be made of non-conductive dielectric materials, while the second spacer 124 is located between the first spacer 116 and the third spacer 126, and the material of the second spacer 124 preferably contains metal (such as titanium and tantalum). Because of the large difference between the material of the second spacer 124 and dielectric materials, the etching selectivity is relatively higher, so the second spacer 124 can effectively protect the resistive random access memory 100.

Figure 5:
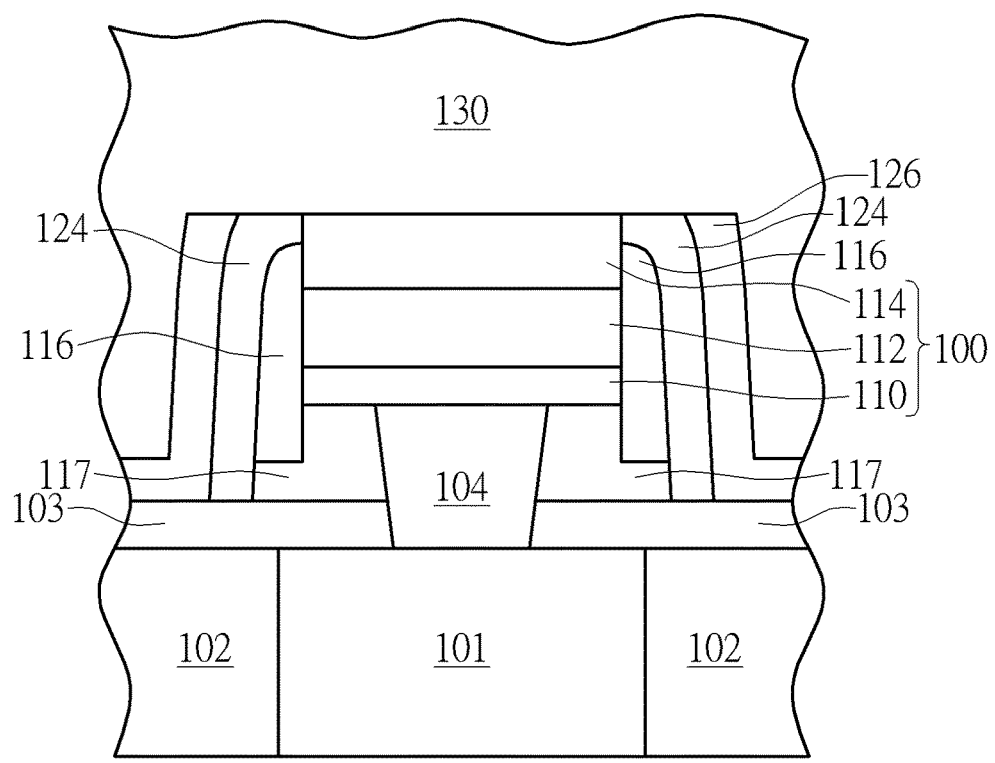
Figure 6:
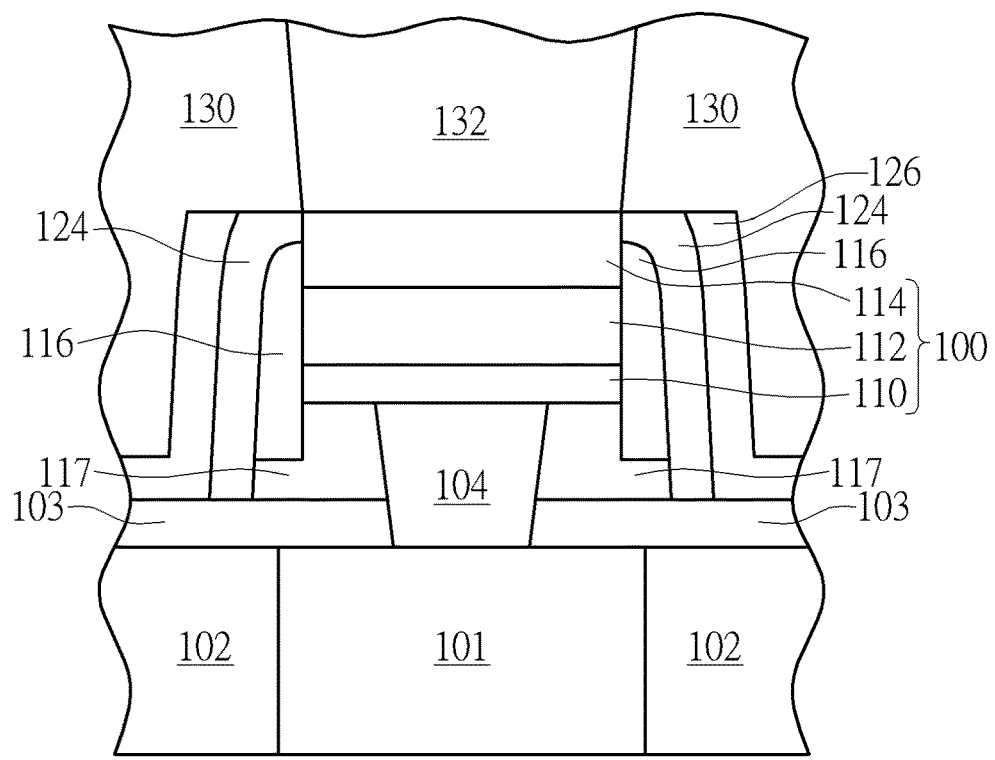

Referring to FIG. 5 and FIG. 6, as shown in FIG. 5, a dielectric layer 130 is formed to cover the resistive random access memory 100 and outside the third spacer 126. The dielectric layer 130 is, for example, an ultra low-k (ULK) dielectric material, and its dielectric constant is preferably lower than 2.9, but is not limited to this. Generally, the commonly used ULK materials may include, but are not limited to, Black Diamond (carbon-doped silicon oxide material with low dielectric coefficient), MSQ (methylsilsesquioxane), porous SiLK (a low dielectric coefficient material developed by Dow Chemical), etc. Then, as shown in FIG. 6, an opening (not shown) is formed in the dielectric layer 130, and after filling the opening with a conductive material (not shown), a planarization step and other steps are performed to form a contact structure 132 in the opening, the contact structure 132 is electrically connected with the upper electrode 114 of the resistive random access memory 100. The contact structure 132 may comprise a conductive material, such as tungsten, cobalt, copper and aluminum.

Compared with the first embodiment (FIG. 1-FIG. 2), the spacer of the resistor random access memory 100 is strengthened in this embodiment, and further, a second spacer 124 and a third spacer 126 are added outside and above the first spacer 116. Since the material of the second spacer 124 includes metal, metal oxide, metal nitride, etc., the material characteristics of the second spacer 124 are quite different from those of the first spacer 116 or the third spacer 126. And the second spacer 124 with sufficient thickness (greater than 20 nm) covers the top of the first spacer 116. Therefore, when an opening is created by etching process, the second spacer 124 can effectively protect the RAM 100, especially the area between the RAM 100 and the spacer, and avoid forming a gap in this area, so that the subsequently formed conductive layer will not fill the gap and affect the performance of the RAM 100.

Hereinafter, different embodiments of the semiconductor structure and its manufacturing method of the present invention will be described. To simplify the description, the following description mainly focuses on the differences of each embodiment, and will not repeat the similarities. In addition, the same elements in each embodiment of the present invention are labeled with the same reference numerals, which is convenient for comparison among the embodiments.

Figure 7:
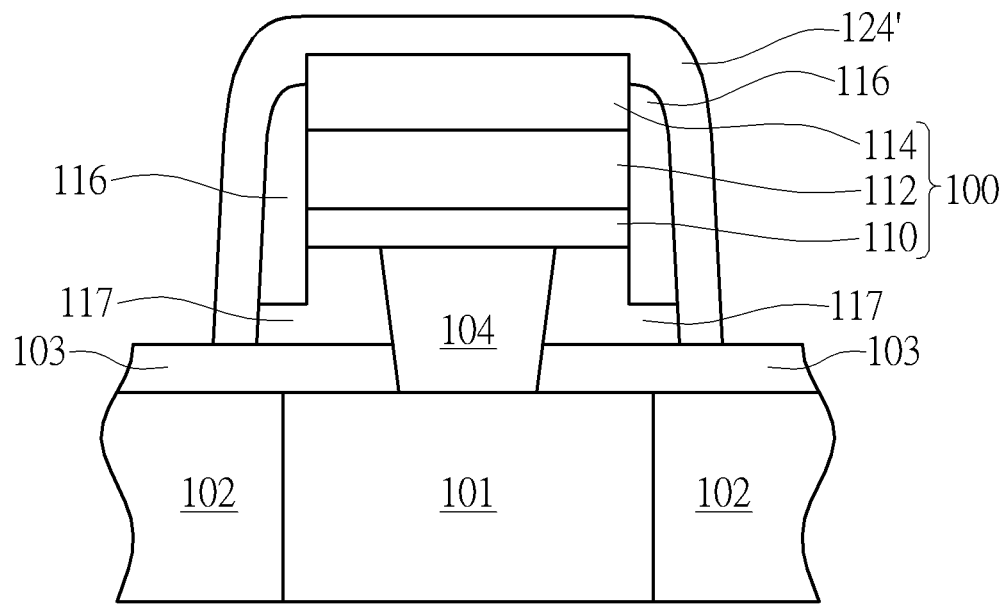
FIG. 7 to FIG. 9 show schematic diagrams of semiconductor structures fabricated according to the third preferred embodiment of the present invention.
Figure 8:
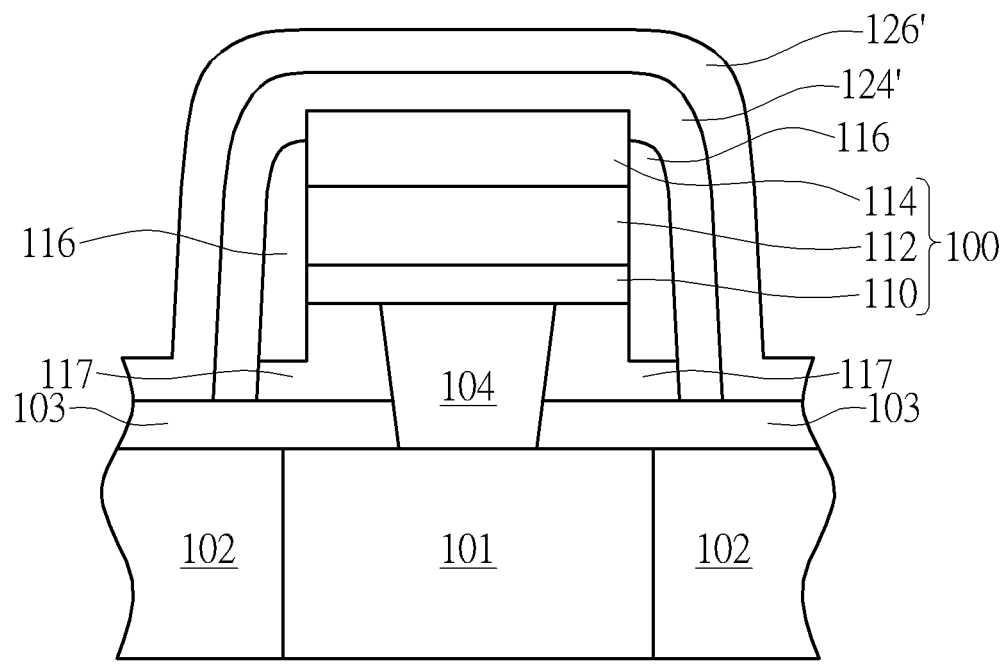

In FIG. 3-FIG. 4 of the second embodiment, after forming the second spacer material layer and the third spacer material layer, an etching back step or a planarization step is performed to partially remove the second spacer material layer and the third spacer material layer, thereby exposing the upper electrode 114 of the resistive random access memory 100. However, in other embodiments of the present invention, the planarization or etch-back step may be omitted. Please refer to FIGS. 7-9, which show schematic diagrams of semiconductor structures fabricated according to the third preferred embodiment of the present invention. In FIG. 7, after forming the structure shown in FIG. 1 (including forming the resistive random access memory 100 and the first spacer 116, etc.), a second spacer material layer 124' is formed above and outside the first spacer 116, and then the planarization step or the etch-back step is omitted temporarily, so the second spacer material layer 124' will cover the top of the upper electrode 114. Then, a patterning step may be performed to partially remove the entire second spacer material layer 124' to avoid conducting with other adjacent circuit elements. Next, as shown in FIG. 8, a third spacer material layer 126' is formed above and outside the second spacer material layer 124', and the planarization step or the etch-back step is also omitted temporarily to the third spacer material layer 126'. In this way, compared with the second embodiment, the process used in this embodiment is simplified, and because the second spacer material layer 124' and the third spacer material layer 126' directly cover the top of the upper electrode 114, the upper electrode 114 can be better protected.

Figure 9:
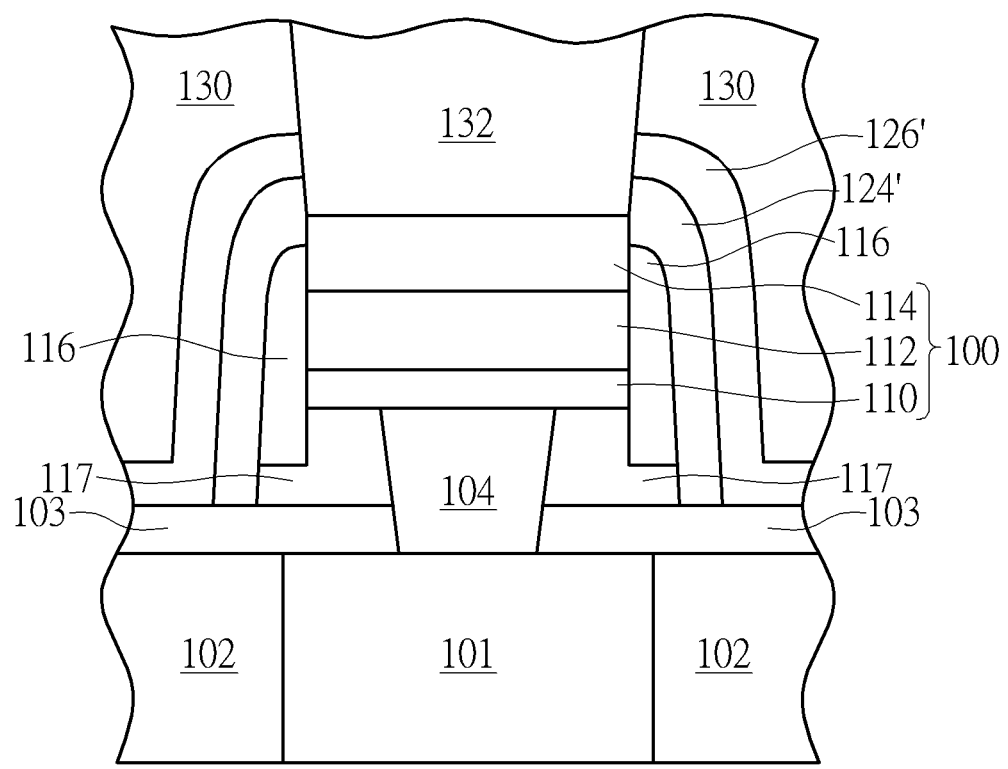

Then, as shown in FIG. 9, after the dielectric layer 130 is formed, an opening (not shown) is preferably formed in the dielectric layer 130 by multiple etching steps, the opening penetrates part of the third spacer material layer 126' and parts of the second spacer material layer 124', and then the opening is filled with a conductive material to form a contact structure 132 for electrically connecting the upper electrode 114. At this time, the remaining second spacer material layer 124' and third spacer material layer 126' are defined as second spacer 124 and third spacer 126, respectively. The material of the dielectric layer 130 is, for example, the ULK material, and the contact structure 132 is, for example, made of conductive metal, etc. The features of this part are the same as those described in the above second embodiment, and will not be described in detail here.

In addition, since the second spacer material layer is not planarized or etched back in this embodiment, a top surface of the resistive random access memory 100 (that is, the top surface of the upper electrode 114) is lower than a top surface of the second spacer 124. This embodiment also falls within the scope of the present invention.

Combining the above FIGS. 1-9, in an embodiment of the present invention, a semiconductor structure is provided, which includes a resistive random access memory (RRAM), a first spacer located at both sides of the RRAM, a second spacer located outside the first spacer, wherein the second spacer comprises a metal material or a metal oxide material, and a third spacer located outside the second spacer.

In some embodiments of the present invention, the material of the first spacer comprises silicon nitride.

In some embodiments of the present invention, the material of the third spacer comprises silicon oxide.

In some embodiments of the present invention, the materials of the second spacer include titanium, titanium nitride, titanium oxide, tantalum, tantalum nitride, aluminum nitride and aluminum oxide.

Some embodiments of the present invention further include a contact structure located on a top surface of the resistance random access memory and electrically connected with the resistance random access memory.

In some embodiments of the present invention, the top surface of the resistive random access memory and a top surface of the second spacer are flush with (aligned with) each other.

In some embodiments of the present invention, the top surface of the resistive random access memory is lower than a top surface of the second spacer.

In some embodiments of the present invention, when viewed in a vertical direction, the second spacer covers part of the first spacer.

In some embodiments of the present invention, the thickness of a part of the second spacer covering the first spacer is between 20 nm and 60 nm.

Some embodiments of the present invention further comprise a dielectric layer covering the third spacer, wherein the material of the dielectric layer comprises an ultra-low dielectric constant material.

In another embodiment of the present invention, a method for fabricating a semiconductor structure includes providing a resistive random access memory (RRAM), forming a first spacer junction on both sides of the RRAM, forming a second spacer outside the first spacer, wherein the second spacer comprises metal material or metal oxide material, and forming a third spacer outside the second spacer.

In some embodiments of the present invention, the material of the first spacer comprises silicon nitride.

In some embodiments of the present invention, the material of the third spacer comprises silicon oxide.

In some embodiments of the present invention, the materials of the second spacer include titanium, titanium nitride, titanium oxide, tantalum, tantalum nitride, aluminum nitride and aluminum oxide.

Some embodiments of the present invention further include forming a contact structure on a top surface of the resistance random access memory and electrically connecting with the resistance random access memory.

In some embodiments of the present invention, the top surface of the resistive random access memory and a top surface of the second spacer are flush with each other.

In some embodiments of the present invention, the top surface of the resistive random access memory is lower than a top surface of the second spacer.

In some embodiments of the present invention, when viewed in a vertical direction, the second spacer covers part of the first spacer.

In some embodiments of the present invention, the thickness of a part of the second spacer covering the first spacer is between 20 nm and 60 nm.

Some embodiments of the present invention further comprise a dielectric layer covering the third spacer, wherein the material of the dielectric layer comprises an ultra-low dielectric constant material.

To sum up, in some embodiments of the present invention, the spacer of the resistance random access memory is strengthened, and further, the second spacer and the third spacer are added outside and above the first spacer. Because the second spacer is made of metal or metal oxide, metal nitride, etc., the material characteristics are quite different from those of the first spacer or the third spacer, and the second spacer with sufficient thickness covers the top of the first spacer. Therefore, when the opening is produced by etching process, the second spacer can effectively protect the RRAM, especially the area between the RRAM and the spacer, and avoid an issue that forming a gap in this area, and the subsequently formed conductive layer will not fill the gap and affect the performance of the RRAM.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a resistance random access memory (RRAM);
   a first spacer located at two sides of the RRAM;
   a second spacer located outside the first spacer, wherein the second spacer comprises metal material or metal oxide material, and a top surface of the first spacer is completely covered by the second spacer; and
   a third spacer located outside the second spacer, wherein a top surface of the second spacer and a top surface of the third spacer are disposed on a same level, and wherein a bottom surface of the second spacer and a bottom surface of the third spacer are disposed on a same level.

2. The semiconductor structure according to claim 1, wherein the material of the first spacer comprises silicon nitride.

3. The semiconductor structure according to claim 1, wherein the material of the third spacer comprises silicon oxide.

4. The semiconductor structure according to claim 1, wherein the material of the second spacer comprises titanium, titanium nitride, titanium oxide, tantalum, tantalum nitride, aluminum nitride and aluminum oxide.

5. The semiconductor structure according to claim 1, further comprising a contact structure located on a top surface of the resistance random access memory and electrically connected with the resistance random access memory.

6. The semiconductor structure according to claim 1, wherein the top surface of the resistive random access memory and a top surface of the second spacer are aligned with each other.

7. The semiconductor structure of claim 1, wherein the top surface of the resistive random access memory is lower than a top surface of the second spacer.

8. The semiconductor structure according to claim 1, wherein the second spacer covers part of the first spacer when viewed in a vertical direction.

9. The semiconductor structure according to claim 8, wherein a thickness of a part of the second spacer covering the first spacer is between 20 nm and 60 nm.

10. The semiconductor structure according to claim 1, further comprising a dielectric layer covering the third spacer, wherein the material of the dielectric layer comprises an ultra-low dielectric constant material.

11. A manufacturing method of a semiconductor structure, comprising:
    providing a resistive random access memory (RRAM);
    forming a first spacer on both sides of the resistance random access memory;
    forming a second spacer outside the first spacer, wherein the second spacer comprises metal material or metal oxide material, and a top surface of the first spacer is completely covered by the second spacer; and
    forming a third spacer outside the second spacer, wherein a top surface of the second spacer and a top surface of the third spacer are disposed on a same level, and wherein a bottom surface of the second spacer and a bottom surface of the third spacer are disposed on a same level.

12. The method according to claim 11, wherein the material of the first spacer comprises silicon nitride.

13. The method according to claim 11, wherein the material of the third spacer comprises silicon oxide.

14. The method according to claim 11, wherein the material of the second spacer comprises titanium, titanium nitride, titanium oxide, tantalum, tantalum nitride, aluminum nitride and aluminum oxide.

15. The method according to claim 11, further comprising forming a contact structure on a top surface of the resistance random access memory and electrically connecting with the resistance random access memory.

16. The method according to claim 11, wherein a top surface of the resistive random access memory and a top surface of the second spacer are aligned with each other.

17. The method according to claim 11, wherein a top surface of the resistive random access memory is lower than a top surface of the second spacer.

18. The method according to claim 11, wherein the second spacer covers part of the first spacer when viewed in a vertical direction.

19. The method according to claim 18, wherein a thickness of a part of the second spacer covering the first spacer is between 20 nm and 60 nm.

20. The method according to claim 11, further comprising forming a dielectric layer covering the third spacer, wherein the material of the dielectric layer comprises an ultra-low dielectric constant material.

* * * * *